United States Patent
Oh

(10) Patent No.: US 9,196,867 B2
(45) Date of Patent: Nov. 24, 2015

(54) ORGANIC LIGHT EMITTING DISPLAY APPARATUS AND MANUFACTURING METHOD THEREOF

(71) Applicant: Samsung Display Co., Ltd., Yongin, Gyeonggi-Do (KR)

(72) Inventor: Hyun-Joon Oh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 221 days.

(21) Appl. No.: 13/948,063

(22) Filed: Jul. 22, 2013

(65) Prior Publication Data

US 2014/0232258 A1    Aug. 21, 2014

(30) Foreign Application Priority Data

Feb. 15, 2013  (KR) .................. 10-2013-0016604

(51) Int. Cl.
   *H05B 33/04* (2006.01)
   *H01L 51/52* (2006.01)

(52) U.S. Cl.
   CPC .......... *H01L 51/5259* (2013.01); *H01L 51/524* (2013.01)

(58) Field of Classification Search
   CPC .................. H01L 51/5259; H01L 51/524
   See application file for complete search history.

(56) References Cited

U.S. PATENT DOCUMENTS

| | | | |
|---|---|---|---|
| 7,063,902 B2 | 6/2006 | Kikuchi et al. | |
| 7,977,876 B2 * | 7/2011 | Yamazaki et al. | 313/512 |
| 8,188,509 B2 | 5/2012 | Lee | |
| 2007/0090759 A1 * | 4/2007 | Choi et al. | 313/512 |
| 2008/0246025 A1 * | 10/2008 | Nomura et al. | 257/40 |
| 2009/0230841 A1 | 9/2009 | Boerner | |
| 2011/0242012 A1 * | 10/2011 | Liu et al. | 345/173 |
| 2011/0248625 A1 * | 10/2011 | Kwon et al. | 313/504 |

FOREIGN PATENT DOCUMENTS

| | | |
|---|---|---|
| JP | 2004-265776 | 9/2004 |
| KR | 10-2011-0054768 | 5/2011 |
| KR | 10-2012-0039753 | 4/2012 |
| WO | WO 2011/016408 A1 | 2/2011 |

* cited by examiner

*Primary Examiner* — Elmito Breval
(74) *Attorney, Agent, or Firm* — Christie, Parker & Hale, LLP

(57) ABSTRACT

An organic light-emitting display apparatus and a method of manufacturing the same are disclosed. An organic light-emitting display apparatus including a substrate, a display unit on the substrate, an encapsulation substrate on the display unit, a sealing member on an edge of the display unit, the sealing member being for bonding the substrate and the encapsulation substrate together, and a filling material filled between the display unit and the encapsulation substrate is disclosed. The filling material has a non-uniform dispersion of fillers such that an amount of the fillers in a first region closer to the display unit is higher than an amount of the fillers in a second region closer to the encapsulation substrate.

12 Claims, 4 Drawing Sheets

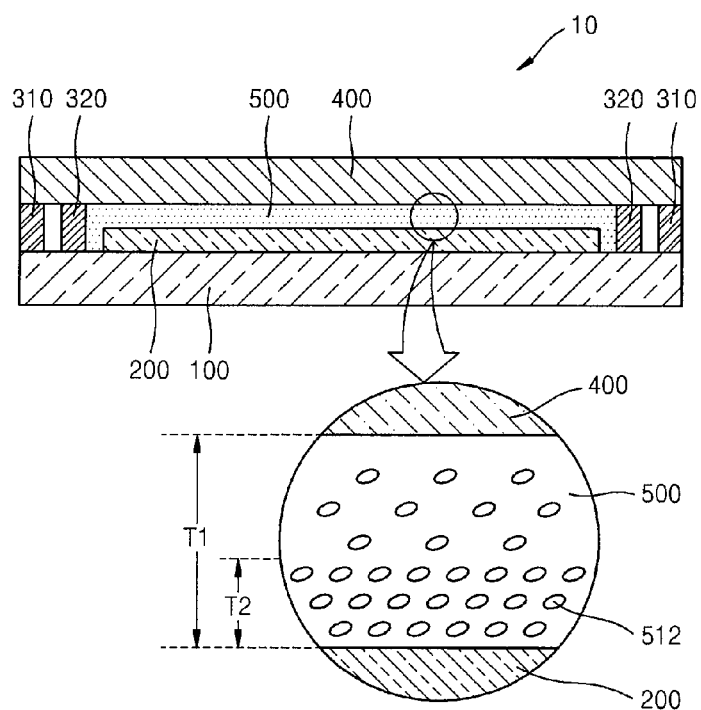
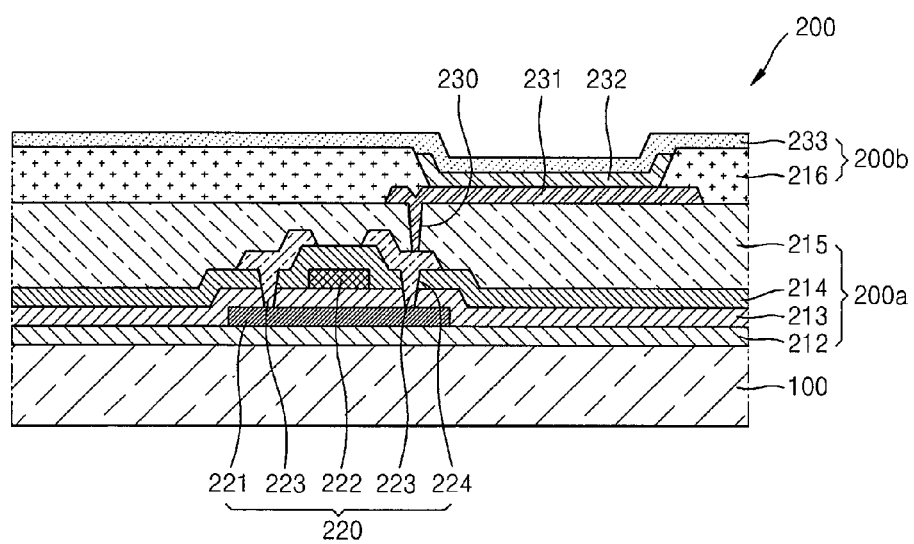

ORGANIC LIGHT EMITTING DISPLAY APPARATUS AND MANUFACTURING METHOD THEREOF

CROSS-REFERENCE TO RELATED PATENT APPLICATIONS

This application claims priority to and the benefit of Korean Patent Application No. 10-2013-0016604, filed on Feb. 15, 2013, in the Korean Intellectual Property Office, the disclosure of which is incorporated herein in its entirety by reference.

BACKGROUND

1. Field

One or more aspects of embodiments according to the present invention relate to an organic light-emitting display apparatus and a method of manufacturing the same.

2. Description of the Related Art

Recently, display apparatuses are being replaced with thin flat panel display apparatuses, some of which are portable. Among flat panel display apparatuses, an electroluminescent display apparatus, which is a self-emitting display apparatus, having a wide viewing angle, high contrast, and a fast response speed has drawn attention as a next-generation display apparatus. Also, an organic light-emitting display apparatus including an emission layer formed of an organic material has high brightness, driving voltage, and response speed characteristics, as compared to an inorganic light-emitting display apparatus, and may provide multi-color images.

The organic light-emitting display apparatus includes a substrate including a display unit, and an encapsulation substrate on the display unit. The substrate and the encapsulation substrate are bonded via a sealant or the like. However, as an organic light-emitting display apparatus has been developed to become bigger, the size and weight of the encapsulation substrate have increased. Thus, in order to secure mechanical reliability of the organic light-emitting display apparatus, a method of filling a filling material between the substrate and the encapsulation substrate has been suggested.

The filling material is a thermally curable type or ultraviolet (UV) curable type, contains a reactive group that may react to heat or UV light, and further contains a mixture of various additives such as an anti-oxidant containing an organic material, and a coupling agent. Since organic materials contained in the filling material have high reactivity, the organic materials in the filling material may react with an organic light-emitting diode when the organic materials of the filling material diffuse toward the organic light-emitting diode, thereby causing errors, such as dark spots and pixel shrinkage, to occur.

SUMMARY

Aspects of embodiments according to the present invention are directed toward an organic light-emitting display apparatus in which occurrence of errors such as dark spots and pixel shrinkage can be minimized or reduced, and a method of manufacturing the same.

According to an embodiment of the present invention, an organic light-emitting display apparatus includes a substrate, a display unit on the substrate, an encapsulation substrate on the display unit, a sealing member on an edge of the display unit, the sealing member being for bonding the substrate and the encapsulation substrate together, and a filling material filled between the display unit and the encapsulation substrate. The filling material includes a non-uniform dispersion of fillers such that an amount of the fillers in a first region closer to the display unit is higher than an amount of the fillers in a second region closer to the encapsulation substrate.

55 wt % to 95 wt % of the fillers, based on the total weight of the fillers, may be present in a range of 50% or less of a thickness of the filling material.

40 wt % to 90 wt % of the fillers, based on the total weight of the fillers, may be present in a range of 25% or less of a thickness of the filling material.

The fillers may have a size of 1 μm or more, and less than or equal to one third of a thickness of the filling material.

The fillers may include at least one of talc, mica, silica, glass fiber, silica gel, or zeolite.

The filling material may include a first layer and a second layer on the first layer. An amount of the fillers in the first layer may be higher than an amount of the fillers in the second layer.

The first layer may have a thickness from 5 to 10 μm.

The amount of the fillers in the first layer may be higher by 5 wt % or more than the amount of the fillers in the second layer, based on the respective total weights of the fillers of the first layer and the second layer, and may be 50 wt % or less of the total content of solid contents in the first layer.

The content of the fillers in the first layer may be higher by 10 wt % or more than the content of the fillers in the second layer, based on the respective total weights of the fillers of the first layer and the second layer, and may be 50 wt % or less of the total content of solid contents in the first layer.

The organic light-emitting display apparatus may further include an inorganic film between the filling material and the display unit.

The inorganic film may have a thickness of 1 μm or less.

The organic light-emitting display apparatus may further include a moisture absorbent at an inner side of the sealing member.

According to another embodiment of the present invention, a method of manufacturing an organic light-emitting display apparatus includes: placing a display unit on a surface of a substrate; placing a filling material including fillers on a surface of an encapsulation substrate; applying a sealing member on a surface of the substrate or the encapsulation substrate; and bonding the substrate and the encapsulation substrate together via the sealing member. The fillers are non-uniformly dispersed in the filling material such that an amount of the fillers in a first region closer to the display unit is higher than an amount of the fillers in a second region closer to the encapsulation substrate.

The placing of the filling material may include laminating a filling film on a surface of the encapsulation substrate, the filling film being obtained by coating a prepared liquid of the filling material onto a base substrate; and removing the base substrate.

The non-uniform dispersion of the fillers may be obtained by the fillers being sunken within the filling film due to a gravitational force.

The prepared liquid of the filling material may have a viscosity of 100 cps to 5000 cps.

The fillers may be dispersed such that 55 wt % to 95 wt % of the fillers are present in a range of 50% or less of a thickness of the filling material, based on the total weight of the fillers.

The fillers may be dispersed such that 40 wt % to 90 wt % of the fillers are present in a range of 25% or less of the thickness of the filling material, based on the total weight of the fillers.

The filling material may include a first layer and a second layer on the first layer. An amount of the fillers in the first layer may be higher than an amount of the fillers in the second layer.

The placing of the filling material may include placing an inorganic film on a surface of the filling material.

The method may further include placing a moisture absorbent at an inner side of the sealing member.

BRIEF DESCRIPTION OF THE DRAWINGS

The above and other features and aspects of the present invention will become more apparent by describing in more detail exemplary embodiments thereof with reference to the attached drawings in which:

FIG. 1 is a schematic cross-sectional view of an organic light-emitting display apparatus according to an embodiment of the present invention;

FIG. 2 is a schematic cross-sectional view of a display unit included in the organic light-emitting display apparatus of FIG. 1;

DETAILED DESCRIPTION

Figure 3:
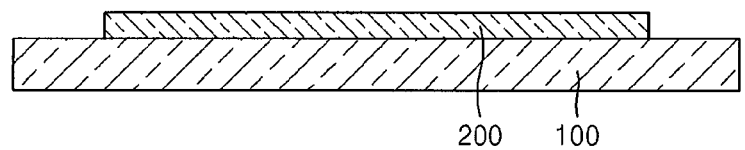
FIGS. 3 to 6 are schematic cross-sectional views sequentially illustrating a method of manufacturing the organic light-emitting display apparatus of FIG. 1 according to an embodiment of the present invention.

Hereinafter, the present invention will be described more fully with reference to the accompanying drawings, in which exemplary embodiments of the invention are shown. The invention may, however, be embodied in many different forms and should not be construed as being limited to the exemplary embodiments set forth herein. It would be apparent to those of ordinary skill in the art that the exemplary embodiments cover all modifications, equivalents, and alternatives falling within the scope of the invention. In the following description, well-known functions or constructions are not described in unnecessary detail if it is determined that such description would obscure the invention.

It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section.

It will be understood that when an element or layer is referred to as being "on" another element or layer, the element or layer can be directly on the other element or layer or be indirectly on the other element with one or more intervening elements or layers interposed therebetween. In contrast, when an element is referred to as being "directly on" another element or layer, there are no intervening elements or layers present.

In the drawings, elements that are substantially the same or that correspond to each other are assigned the same reference numeral and are not redundantly described. Also, the lengths and sizes of layers and regions may be exaggerated for clarity.

As used herein, the term 'and/or' includes any and all combinations of one or more of the associated listed items. Expressions such as "at least one of," when preceding a list of elements, modify the entire list of elements and do not modify the individual elements of the list. As used herein, the terms "content," "amount," and "concentration" may be used interchangeably.

FIG. 1 is a schematic cross-sectional view of an organic light-emitting display apparatus 10 according to an embodiment of the present invention. FIG. 2 is a schematic cross-sectional view of a display unit 200 included in the organic light-emitting display apparatus 10 of FIG. 1.

Referring to FIGS. 1 and 2, the organic light-emitting display apparatus 10 may include a substrate 100, the display unit 200 on the substrate 100, an encapsulation substrate 400 facing the substrate 100, a sealing member 310 that seals the display unit 200 by bonding the substrate 100 and the encapsulation substrate 400 together, and a filling material 500 between the display unit 200 and the encapsulation substrate 400.

The substrate 100 may be formed of a $SiO_2$-based transparent glass material, but is not limited thereto and may be formed of a transparent plastic material. For example, a plastic material that may be used to form the substrate 100 may be an insulating organic material selected from the group consisting of polyethersulphone (PES), polyacrylate (PAR), polyetherimide (PEI), polyethylenenaphthalate (PEN), polyethyleneterephthalate (PET), polyphenylenesulfide (PPS), polyallylate, polyimide, polycarbonate (PC), cellulosetriacetate (TAC), and celluloseacetatepropionate (CAP).

If the organic light-emitting display apparatus 10 is a bottom emission type display apparatus in which an image is displayed toward the substrate 100, the substrate 100 is formed of a transparent material. However, if the organic light-emitting display apparatus 10 is a top emission type display apparatus in which an image is displayed in a direction opposite to the substrate 100, the substrate 100 may be formed of a transparent or a non-transparent material. For example, when the organic light-emitting display apparatus 10 is a top emission type display apparatus, the substrate 100 may be formed of carbon or a metal selected from the group consisting of iron, chromium, manganese, nickel, titanium, molybdenum, and stainless steel (SUS) but is not limited thereto.

The display unit 200 may include an organic thin film transistor (TFT) layer 200a including a TFT 220, and a pixel unit 200b. The pixel unit 200b may be an organic light-emitting diode (OLED). The display unit 200 will now be described with reference to FIG. 2 below.

A buffer layer 212 may be formed on the substrate 100. The buffer layer 212 prevents impurity elements from penetrating via the substrate 100 (or reduces the amount of impurity elements that penetrate via the substrate), provides a flat surface on the substrate 100, and may be formed of any of various suitable materials for performing the above functions. For example, the buffer layer 212 may be formed of an inorganic material (e.g., silicon oxide, silicon nitride, silicon oxynitride, aluminum oxide, aluminum nitride, titanium oxide, titanium nitride, and the like), an organic material (e.g., polyimide, polyester, acryl, and the like), or a stacked structure thereof.

The buffer layer 212 may be deposited according to any of various deposition methods, such as plasma enhanced chemical vapor deposition (PECVD), atmospheric pressure chemical vapor deposition (APCVD), or low pressure chemical vapor deposition (LPCVD).

An active layer 221 may be obtained by forming an inorganic semiconductor, such as silicon, or an organic semiconductor on the buffer layer 212. The active layer 221 includes a source region, a drain region, and a channel region between the source and drain regions. For example, in order to form the active layer 221 of amorphous silicon, an amorphous silicon layer may be formed on the entire substrate 100 and then be crystallized to form a polycrystalline silicon layer. The polycrystalline silicon layer is then patterned, and impurities are doped onto source and drain regions at edges of the patterned polycrystalline silicon layer, thereby forming the active layer 221 including the source and drain regions and the channel region between the source and drain regions.

A gate insulating film 213 is formed on the active layer 221. The gate insulating film 213 may be formed of an inorganic material, such as SiNx, $SiO_2$, or the like, to insulate the active layer 221 and a gate electrode 222 from each other.

The gate electrode 222 is formed on a predetermined (or set) upper region of the gate insulating film 213. The gate electrode 222 is connected to a gate line via which an 'on/off' signal is applied to the organic TFT layer 200a.

The gate electrode 222 may contain Au, Ag, Cu, Ni, Pt, Pd, Al, Mo, an Al:Nd alloy, or an Mo:W alloy, but it is not limited thereto and may be formed of any of other various suitable materials in consideration of design conditions.

An interlayer insulating film 214 formed on the gate electrode 222 may be formed of an inorganic material, such as SiNx, $SiO_2$, or the like, to insulate the gate electrode 222 and source and drain electrodes 223 from one another.

The source and drain electrodes 223 are formed on the interlayer insulating film 214. For example, the interlayer insulating film 214 and the gate insulating film 213 are formed to expose the source and drain regions of the active layer 221, and the source and drain electrodes 223 are formed to contact the exposed source and drain regions of the active layer 221 via contact holes 224.

Although FIG. 2 illustrates the organic TFT layer 200a (which is a top gate TFT) on which the active layer 221, the gate electrode 222, and the source and drain electrodes 223 are sequentially formed, the present invention is not limited thereto and the gate electrode 222 may be disposed below the active layer 221.

The organic TFT layer 200a is electrically connected to the pixel unit 200b to drive the pixel unit 200b, and is protected by being covered with a planarizing film 215.

The planarizing film 215 may include an inorganic insulating film and/or an organic insulating film. The inorganic insulating film may contain $SiO_2$, $SiN_x$, SiON, $Al_2O_3$, $TiO_2$, $Ta_2O_5$, $HfO_2$, $ZrO_2$, barium strontium titanate (BST), lead zirconate titanate (PZT), or the like. The organic insulating film may contain a general polymer, e.g., poly(methyl methacrylate) (PMMA) or polystyrene (PS), a polymer derivative of a phenol group, an acryl-based polymer, an imide-based polymer, an arylester-based polymer, an amide-based polymer, a fluorine-based polymer, a xylene-based polymer, a vinyl alcohol-based polymer, and a mixture thereof. Also, the planarizing film 215 may be formed of a stacked structure including an inorganic insulating film and an organic insulating film.

A pixel unit 200b is formed on the planarizing film 215, and may include a pixel electrode 231, an intermediate layer 232, and an opposite electrode 233.

The pixel electrode 231 is formed on the planarizing film 215 and is electrically connected to the source and drain electrodes 223 via a contact hole 230 in the planarizing film 215.

The pixel electrode 231 may be a reflective electrode, and may include a reflective film formed of Ag, Mg, Al, Pt, Pd, Au, Ni, Nd, Ir, Cr, or a compound (e.g., an alloy) thereof, and a transparent or semi-transparent electrode layer formed on the reflective film. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode 233 facing the pixel electrode 231 may be a transparent or semi-transparent electrode, and may be formed of a metal thin film having low work function including Li, Ca, LiF/Ca, LiF/Al, Al, Ag, Mg, or a compound (e.g., an alloy) thereof. Also, an auxiliary electrode layer or a bus electrode may further be formed on the metal thin film by using a material for forming a transparent electrode, e.g., ITO, IZO, ZnO, or $In_2O_3$.

Thus, the opposite electrode 233 may allow light, which is emitted from an organic emission layer included in the intermediate layer 232, to pass therethrough. For example, light emitted from the organic emission layer may be reflected directly or via the pixel electrode 231 (which may be a reflective electrode), and then be radiated toward the opposite electrode 233.

However, the organic light-emitting display apparatus 10 according to the current embodiment is not limited to a top emission type display apparatus and instead may be a bottom emission type display apparatus in which light emitted from the organic emission layer is radiated toward the substrate 100. In this case, the pixel electrode 231 may be a transparent or semi-transparent electrode and the opposite electrode 233 may be a reflective electrode. In still other embodiments, the organic light-emitting display apparatus 10 according to the current embodiment may be a dual emission type display apparatus in which light is radiated toward both a front surface (e.g., the opposite electrode 233) and a bottom surface (e.g., the substrate 100).

A pixel defining film 216 is formed on the pixel electrode 231 by using an insulating material. The pixel defining film 216 may be formed of at least one organic insulating material selected from the group consisting of polyimide, polyamide, acryl resin, benzocyclobutene, and phenol resin, by spin coating or the like. The pixel defining film 216 exposes a predetermined (or set) region of the pixel electrode 231, and the intermediate layer 232 including the organic emission layer is disposed on the exposed region.

The organic emission layer included in the intermediate layer 232 may include a low-molecular weight organic material or a high-molecular weight organic material. The intermediate layer 232 may further selectively include a functional layer, such as a hole transport layer (HTL), a hole injection layer (HIL), an electron transport layer (ETL), and/or an electron injection layer (EIL).

The substrate 100 including the display unit 200 as described above is bonded with the encapsulation substrate 400 disposed on the display unit 200. The encapsulation substrate 400 may also be a substrate formed of a glass material, a substrate formed of any of various suitable plastic materials such as acryl, or a metal plate.

The substrate 100 and the encapsulation substrate 400 are bonded via the sealing member 310. The sealing member 310 may be a general sealing material such as a sealing glass frit. The sealing member 310 and the encapsulation substrate 400 protect the display unit 200 against external moisture, air, and the like.

A moisture absorbent 320 may further be disposed at a side of the sealing member 310 facing the display unit 200. The moisture absorbent 320 easily reacts with moisture and oxygen to prevent a lifespan of the OLED or the like from decreasing due to the presence of moisture and oxygen (or to reduce the amount that the lifespan is decreased). The moisture absorbent 320 may be formed of alkali metal oxide, alkali-earth metal oxide, metal halide, lithium sulfate, metal sulfate, metal chlorates, silica gel, phosphorous pentoxide, or a mixture thereof. However, the type and location of the moisture absorbent 320 are not limited to those described above.

The filling material 500 is disposed at an inner side of the sealing member 310 to fill a space between the substrate 100 and the encapsulation substrate 400.

The filling material 500 may be formed of epoxy resin, acryl resin, silicon, ethylene vinyl acetate (EVA), polyethylene, and the like, and may be formed to a thickness T1 from 5 μm to 100 μm. The filling material 500 has thermally curable properties or UV curable properties, and may contain a mixture of various suitable additives, such as a hardener, an anti-oxidant, a coupling agent, and the like.

Also, the filling material 500 may include fillers 512. For example, the filling material 500 may be mixed with the fillers 512. The fillers 512 may include at least one among an inorganic filler, e.g., talc, mica, silica, and glass fiber, and a filler capable of inducing physical adsorption, e.g., silica gel and zeolite (e.g., aluminosilicates). The fillers 512 may delay, prevent or reduce degradation of the OLED caused by external oxygen and moisture by lengthening or removing an external oxygen and moisture permeation channel.

The fillers 512 are non-uniformly (e.g., irregularly) dispersed within the filling material 500. For example, the fillers 512 are dispersed such that a content (or an amount) of the fillers 512 in a first region closer to the display unit 200 is higher than a content (or an amount) of the fillers 512 in a second region closer to the encapsulation substrate 400. For example, in some embodiments, a concentration (e.g., a first concentration) of the fillers 512 is higher at a region (e.g., a first region) adjacent to the display unit 200 than a concentration (e.g., a second concentration) of the fillers 512 at a region (e.g., a second region) adjacent to the encapsulation substrate 400. As described above, the closer the fillers 512 are to the display unit 200, the higher the content of the fillers 512 included in the filling material 500 becomes. In this case, it is possible to physically block or delay diffusion of organic materials, which are contained in the filling material 500 and may cause damage to the OLED, toward the OLED, thereby increasing the reliability of the organic light-emitting display apparatus 10.

In some embodiments, 55 wt % to 95 wt % of the fillers 512, based on the total amount of the fillers 512, may be present in a range of 50% or less of the thickness T1 of the filling material 500. In other embodiments, 40 wt % to 90 wt % of the fillers 512, based on the total amount of the fillers 512, may be present in a range of 25% or less of the thickness T1 of the filling material 500. Referring to FIG. 1, 50% or 25% of the thickness T1 of the filling material 500 means a thickness T2 measured starting from a bottom surface of the filling material 500 (e.g., in FIG. 1, T2 could be 50% or 25% of T1). For example, in some embodiments, a region adjacent to the display unit 200 and having a thickness in a range of 50% or less than the thickness T1 contains 55 wt % to 95 wt % of the fillers 512, based on the total amount of the fillers 512. In other embodiments, a region adjacent to the display unit 200 and having a thickness in a range of 25% or less of the thickness T1 contains 40 wt % to 90 wt % of the fillers 512, based on the total weight of the fillers 512.

When the dispersion of the fillers 512 is in the ranges described above, the concentration of the fillers 512 present in a lower portion of the filling material 500 is high, thereby preventing or reducing a decrease in an effect of blocking or delaying diffusion of the organic materials of the filling material 500. At the same time, it is possible to prevent or reduce the occurrence of an error during a lamination process, caused when the fillers 512 are densely dispersed in the lower portion of the filling material 500 and to prevent (or reduce the occurrence of) scratches on the display unit 200, caused by the fillers 512.

The fillers 512 may each have an oval shape, a plate shape, a needle shape, or the like but they are not limited thereto. A degree of dispersion of the fillers 512 during formation of a prepared liquid of a filling material may vary according to the shapes of the fillers 512. Thus, the shapes of the fillers 512 may be appropriately selected in consideration of the viscosity of the prepared liquid, etc.

However, since the roughness of a surface of the filling material 500 may vary according to the size of the fillers 512, the size of the fillers 512 should be less than the thickness T1 of the filling material 500. Here, the size of the fillers 512 means a maximum size of one of the fillers 512 or an aggregation of the fillers 512, which is measured in one direction. For example, the maximum size of the fillers 512 means a size obtained by measuring the longest axis thereof when the fillers 512 have a plate or needle shape, and means a diameter when the fillers 512 have an oval shape.

For example, the size of the fillers 512 may be 1 μm or more and may be less than or equal to one third of the thickness T1 of the filling material 500. If the size of the fillers 512 is less than 1 μm, when the organic materials in the filling material 500 are diffused toward the OLED, the effect of physically blocking or delaying the diffusion of the organic materials may be lowered or reduced. In contrast, when the size of the fillers 512 is greater than one third of the thickness T1 of the filling material 500, the fillers 512 may directly contact the display unit 200, thereby causing scratches on the display unit 200. Thus, the size of the fillers 512 may be 1 μm or more and may be less than or equal to one third of the thickness T1 of the filling material 500. For example, the size of the fillers 512 may be in a range of 1 μm to one third of the thickness T1 of the filling material 500.

FIGS. 3 to 6 are schematic cross-sectional views sequentially illustrating a method of manufacturing the organic light-emitting display apparatus 10 of FIG. 1 according to an embodiment of the present invention.

Referring to FIGS. 1 and 3 to 6, in the method of manufacturing the organic light-emitting display apparatus 10 according to the present embodiment, first, the display unit 200 is formed on or placed on a surface of the substrate 100 as illustrated in FIG. 3. The display unit 200 is as described above with reference to FIG. 2 and may be any of various suitable organic light-emitting displays that are well known in this art. Thus, a method of manufacturing the display unit 200 is not described in more detail here.

Figure 4:
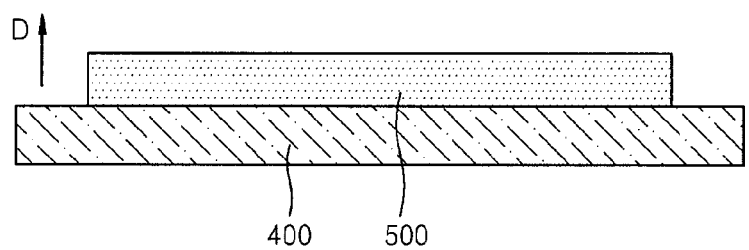

Then, as illustrated in FIG. 4, the filling material 500 is formed on or placed on a surface of the encapsulation substrate 400. For example, the filling material 500 may be formed by laminating a filling film on one surface of the encapsulation substrate 400. The filling film may be formed by coating a prepared liquid of a filling material on a base film. The base film may be any suitable film, such as any suitable polymer film, but the present invention is not limited thereto. The base film may be removed after the filling film is laminated on one surface of the encapsulation substrate 400.

The fillers 512 are dispersed within the filling material 500 such that a content thereof becomes increased toward a direction indicated by an arrow D in FIG. 4. For example, the fillers 512 may be dispersed in the filling material 500 such that a concentration of the fillers 512 increases along the direction indicated by the arrow D in FIG. 4. Such a non-uniform (e.g., irregular) distribution (e.g., a concentration gradient) of the fillers 512 may be controlled based on the principle that the fillers 512 are sunken (e.g., settled to the bottom of the filling material 500) due to a gravitational force during a process of coating a prepared liquid of the filling material. For example, the prepared liquid of the filling material may be coated onto the base film, a release film is attached to the surface of the base film coated with the prepared liquid (e.g., a surface of the prepared liquid after having been coated on the base film), and the release film is moved downward to cause the fillers 512 to be sunken in the coated prepared liquid of the filling material (e.g., the release film, the coated prepared liquid, and the base film are rotated to have the base film at the top and the release film at the bottom, such that the fillers 512 begin to settle toward the release film due to a gravitational force).

In this embodiment, when the viscosity of the prepared liquid of the filling material is too low, the filling film is difficult to form to a desired thickness and the fillers 512 are sunken to an excessive degree (e.g., the resultant display apparatus includes fillers 512 too close to the display unit 200 and/or a concentration of the fillers 512 in a region adjacent to the display unit 200 is too high). Thus, in some embodiments, the viscosity of the prepared liquid of the filling material is 10 cps or more, for example, 100 cps or more. In contrast, when the viscosity of the prepared liquid of the filling material is too high, the fillers 512 are difficult to be sunken. Therefore, in some embodiments, the viscosity of the prepared liquid of the filling material is less than 5000 cps. For example, the viscosity of the prepared liquid of the filling material may be in a range of 10 cps to less than 5000 cps, such as, in a range of 100 cps to less than 5000 cps.

The fillers 512 may each have a plate shape, an oval shape, a needle shape, or the like, but the shapes of the fillers 512 may be selected in consideration of the viscosity of the prepared liquid of the filling material, among other considerations. For example, if the fillers 512 each have a plate shape, a physical path for blocking the organic materials in the filling material 500 is long, thus increasing reliability. However, a degree to which the fillers 512 are sunken in the prepared liquid of the filling material is low due to resistance (e.g., a fluid resistance) according to the shapes of the fillers 512. Thus, use of the prepared liquid of the filling material having low viscosity is desirable. Also, the more the shapes of the fillers 512 are close to an oval shape, the less the effect of blocking an invasion path of the organic materials, but the higher the effect of sinking the fillers 512 within the prepared liquid of the filling material. Accordingly, the fillers 512 may be dispersed to be inclined toward the OLED even in a prepared liquid of the filling material having high viscosity.

As described above, in order to block or delay the diffusion of the organic materials and to prevent or reduce occurrence of an error in the lamination process and scratches on the display unit 200, caused by the fillers 512, in some embodiments, 55 wt % to 95 wt % of the fillers 512, based on the total weight of the fillers, are present in a range of 50% or less of the thickness T1 of the filling material 500 and, in other embodiments, 40 wt % to 90 wt % of the fillers 512, based on the total amount of the fillers 512, are present in a range of 25% or less of the thickness T1 of the filling material 500. Also, in some embodiments, the size of one of the fillers 512 is 1 μm or more and less than or equal to one third of the thickness T1 of the filling material 500.

Figure 5:
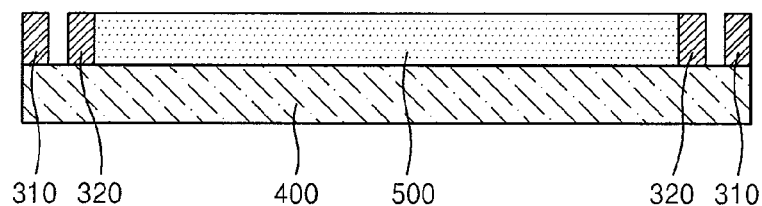

Next, as illustrated in FIG. 5, the sealing member 310 is formed to (e.g., applied to) surround (e.g., partially surround) the filling material 500.

The sealing member 310 may be formed by applying a sealing material in a liquid or paste form. Although the sealing member 310 is illustrated as being formed on one surface of the encapsulation substrate 400, the present invention is not limited thereto and the sealing member 310 may be formed on one surface of the substrate 100.

The moisture absorbent 320 may further be formed at (e.g., applied to) an inner side of the sealing member 319. The moisture absorbent 320 may be formed by applying a moisture absorbing material in a liquid form.

Figure 6:
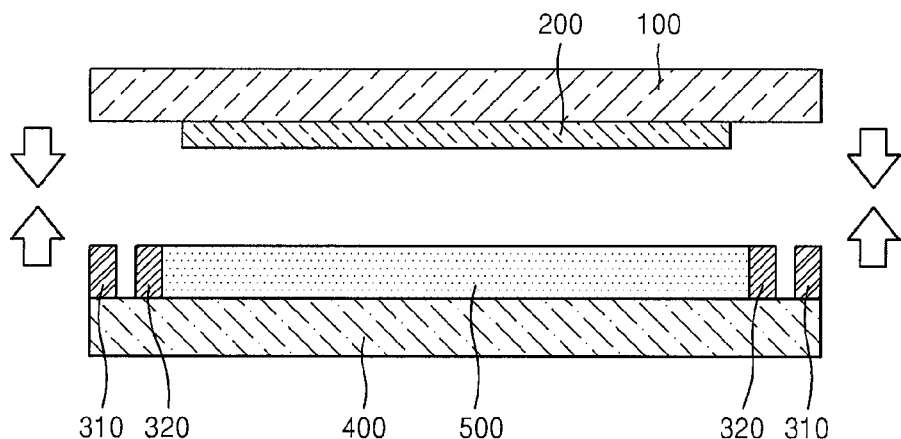

Next, as illustrated in FIG. 6, the substrate 100 and the encapsulation substrate 400 are bonded together via the sealing member 310.

More specifically, the substrate 100 and the encapsulation substrate 400 are disposed to face each other, and are bonded to each other (e.g., together) by irradiating ultraviolet rays onto portions of the substrate 100 and the encapsulation substrate 400 corresponding to the sealing member 310 in a vacuum state. When the substrate 100 and the encapsulation substrate 400 are bonded in the vacuum state, it is possible to minimize or reduce penetration of external moisture and foreign substances thereinto.

Also, when ultraviolet rays are irradiated onto the portions of the substrate 100 and the encapsulation substrate 400 contacting the sealing member 310, these portions may be melted to cause the substrate 100 and the encapsulation substrate 400 to be bonded to each other. However, the present invention is not limited thereto and any of various suitable other methods may be used to bond the substrate 100 and the encapsulation substrate 400, based on the type of the sealing member 310.

Also, when ultraviolet rays are irradiated onto the substrate 100 and the encapsulation substrate 400, the organic materials present in the filling material 500 may be diffused (e.g., dispersed) due to the energy of the irradiated ultraviolet rays. The diffused organic materials having high reactivity may then react with the OLED to cause an error, such as dark spots and pixel shrinkage, to occur. However, according to the present invention, the fillers 512 are dispersed such that the closer the fillers 512 in the filling material 500 are to the display unit 200, the higher the content of the fillers 512 is. Thus, diffusion of the organic materials, which may cause damage to the OLED, toward the OLED may be physically blocked or delayed by the fillers 512, thereby increasing the reliability of the organic light-emitting display apparatus 10.

Figure 7:
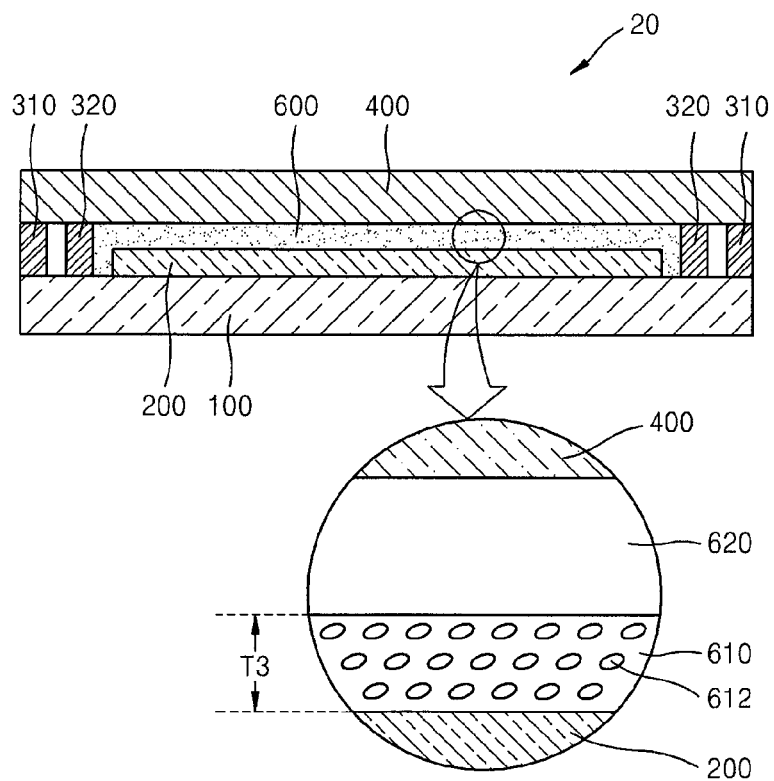
FIG. 7 is a schematic cross-sectional view of one modified example of the organic light-emitting display apparatus of FIG. 1.

FIG. 7 is a schematic cross-sectional view of another embodiment of an organic light-emitting display apparatus. In FIG. 7, an organic light-emitting display apparatus 20 is a modified example of the organic light-emitting display apparatus 10 of FIG. 1.

Referring to FIG. 7, the organic light-emitting display apparatus 20 may include a substrate 100, a display unit 200 formed on the substrate 100, an encapsulation substrate 400 facing the substrate 100, a sealing member 310 for sealing the display unit 200 by bonding the substrate 100 and the encapsulation substrate 400 together, and a second filling material 600 between the display unit 200 and the encapsulation substrate 200. The organic light-emitting display apparatus 20 may further include a moisture absorbent 320 at (e.g., disposed at) a side of the sealing member 310 facing the display unit 200.

The substrate 100, the display unit 200, the sealing member 310, the moisture absorbent 320, and the encapsulation substrate 400 are the same (or substantially the same) as those described above with reference to FIGS. 1 and 2, and are thus not described again here. The organic light-emitting display apparatus 20 of FIG. 7 will now be described with emphasis on certain differences between the organic light-emitting display apparatus 20 and the organic light-emitting display apparatus 10 of FIGS. 1 and 2.

Referring to FIG. 7, a second filling material 600 includes fillers 612 such that a content (or an amount) of the fillers 612 present in a first region closer to the display unit 200 is higher than a content (or an amount) of the fillers 612 present in a second region closer to the encapsulation substrate 400. For example, in some embodiments, a concentration (e.g., a first concentration) of the fillers 612 is higher at a region (e.g., a first region) adjacent to the display unit 200 than a concentration (e.g., a second concentration) of the fillers 612 at a region (e.g., a second region) adjacent to the encapsulation substrate 400.

In some embodiments, the second filling material 600 may include a first layer 610 and a second layer 620 formed on the first layer 610. The content (or amount) of the fillers 612 in the first layer 610 may be higher than that of the fillers 612 in the second layer 620.

When a prepared liquid of a filling material has high viscosity and the filling material is thus difficult to be sunken, the second filling material 600 may be formed by sequentially stacking the first layer 610 having relatively high content of the fillers 612 and the second layer 620 having content of the fillers 612 lower than that of the first layer 610 by coating or the like.

The first layer 610 may include (e.g., be formed of) epoxy resin, acryl resin, silicon, ethylene vinyl acetate (EVA), polyethylene, and the like. The more (e.g., the higher) the content (or amount) of fillers 612 contained in the first layer 610, the more effectively the fillers 612 may block organic materials from being diffused toward the display unit 200. To this end, the content of the fillers 612 contained in the first layer 610 may be higher by at least 5 wt % or more and, in some embodiments, 10% or more than the content of the fillers 612 contained in the second layer 620, based on the respective total weights of the fillers 612 of the first layer 610 and the second layer 620.

However, when the content (or amount) of the fillers 612 contained in the first layer 610 is higher than 50 wt % of the total content of solid contents (e.g., the fillers 612 and any additional solid contents) contained in the first layer 610, a dispersion rate of the fillers 612 in the prepared liquid of the filling material may be too low and cause lumps of the fillers 612 or the like and degrade the quality of a coating film to be formed. Thus, the content of the fillers 612 in the first layer 610 may be 50 wt % or less of the total content of solid contents in the first layer 610.

Also, when a thickness T3 (shown in FIG. 7) of the first layer 610 is excessively thin, the film properties of the first layer 610 may be degraded due to the relative sizes of the fillers 612. When the thickness T3 of the first layer 610 is excessively thick, the entire physical properties of the second filling material 600 may be degraded due to the properties of the first layer 610 being brittle. Accordingly, in some embodiments, the thickness T3 of the first layer 610 is from 5 to 10 μm.

The second layer 620 may include (e.g., be formed of) epoxy resin, acryl resin, silicon, ethylene vinyl acetate (EVA), polyethylene, etc., and may include fillers 612, similar to the first layer 610. When the second layer 620 contains the fillers 612, the content of the fillers 612 in the second layer 620 may have a non-uniform (e.g., irregular) distribution (e.g., a concentration gradient) in that the content of the fillers 612 becomes increased along a direction toward the display unit 200. However, the present invention is not limited thereto and the second layer 620 may not include the fillers 612, for example, as illustrated in FIG. 7.

The organic light-emitting display apparatus 20 of FIG. 7 may be manufactured according to a method described above with reference to FIGS. 3 to 6.

Figure 8:
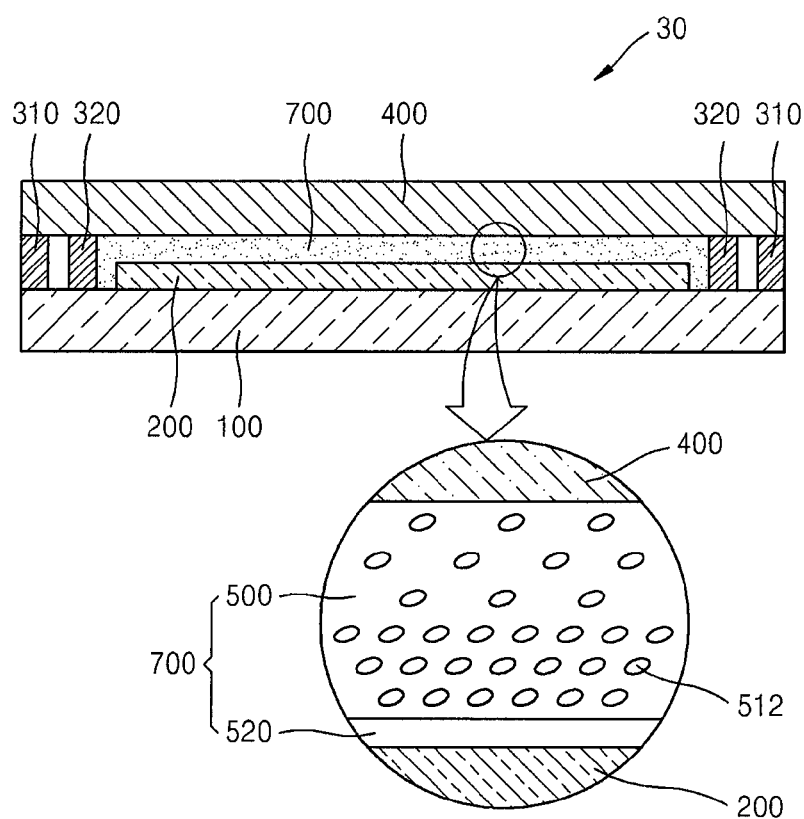
FIG. 8 is a schematic cross-sectional view of another modified example of the organic light-emitting display apparatus of FIG. 1.

FIG. 8 is a schematic cross-sectional view of another embodiment of an organic light-emitting display apparatus. In FIG. 8, an organic light-emitting display apparatus 30 is a modified example of the organic light-emitting display apparatus 10 of FIG. 1.

The organic light-emitting display apparatus 30 of FIG. 8 may include a substrate 100, a display unit 200 on the substrate 100, an encapsulation substrate 400 facing the substrate 100, a sealing member 310 for sealing the display unit 200 by bonding the substrate 100 and the encapsulation substrate 400 to each other, a moisture absorbent 320 disposed at a side of the sealing member 310 facing the display unit 200, and a third filling material 700 between the display unit 200 and the encapsulation substrate 200.

The substrate 100, the display unit 200, the sealing member 310, the moisture absorbent 320, and the encapsulation substrate 400 are the same as those described above with reference to FIGS. 1 and 2 and are not thus described again here. The organic light-emitting display apparatus 30 of FIG. 8 will now be described with emphasis on certain differences between the organic light-emitting display apparatus 30 and the organic light-emitting display apparatus 10 of FIGS. 1 and 2.

Referring to FIG. 8, the third filling material 700 may have the filling material 500 having a structure as described above with reference to FIG. 1, and an inorganic film 520 between the filling material 500 and the display unit 200.

The filling material 500 may be formed of epoxy resin, acryl resin, silicon, ethylene vinyl acetate (EVA), polyethylene, etc., may have thermally curable properties or UV curable properties, and may contain a mixture of various additives such as a hardener, an anti-oxidant, a coupling agent, and the like. Also, the filling material 500 includes a non-uniform (e.g., irregular) dispersion (e.g., a concentration gradient) of the fillers 512 such that a content (or an amount) of the fillers 512 in a first region closer to the display unit 200 is higher than a content (or an amount) of the fillers 512 in a second region closer to the encapsulation substrate 400. Thus, diffusion of organic materials, which are present in the filling material 500 and may cause damage to an OLED, toward the OLED may be physically blocked or delayed.

The inorganic film 520 may include (e.g., be formed of) polysilazane, $TiO_2$, $Y_2O_3$, YSZ, CaO, and the like, and may more securely block or delay diffusion of the organic materials in the filling material 500 toward the OLED. Also, when external oxygen and moisture penetrate into the filling material 500, the external oxygen and moisture may be prevented from penetrating into the OLED, or the amount of oxygen and moisture that penetrates into the OLED may be reduced, by the inorganic film 520.

The thicker the inorganic film 520, the more effectively diffusion of the organic materials of the filling material 500 or penetration of external moisture and oxygen into the OLED may be prevented or reduced. However, the thicker the inorganic film 520, the more easily cracks may occur in the inorganic film 520 when stress is applied to the inorganic film 520. Thus, the inorganic film 520 has (e.g., is formed of) a thickness of 1 μm or less.

The inorganic film 520 may be formed by coating a low-temperature curable glass film coating material such as polysilazane on a surface of the filling material 500 by spraying, screen-printing, dispensing, or the like, or it may be formed by applying $TiO_2$, $Y_2O_3$, YSZ, CaO, or the like by aerosol deposition.

Also, the organic light-emitting display apparatus 30 of FIG. 8 may be manufactured using the second filling material 700 including the inorganic film 520 and according to the method described above with reference to FIGS. 3 to 6.

Although FIG. 8 illustrates an embodiment in which the inorganic film 520 is formed on a bottom surface of the filling material 500 of the embodiment shown in FIG. 1, the present invention is not limited thereto and the inorganic film 520 may be formed on a bottom surface of the filling material 600 of the embodiment shown FIG. 7.

The present invention is not limited to the embodiments set forth herein, and these embodiments may be modified in various ways through selective combination of a part of or the entire details of these embodiments.

According to aspects of an embodiment of the present invention, organic materials having high reactivity contained in a filling material are prevented from being moved toward an OLED (or the amount of the organic materials that reach the OLED is reduced), thereby minimizing or reducing occurrence of errors such as dark spots and pixel shrinkage, caused by a reaction between the OLED and the filling material.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising:
a substrate;
a display unit on the substrate;
an encapsulation substrate on the display unit;
a sealing member on an edge of the display unit, the sealing member being for bonding the substrate and the encapsulation substrate together; and
a filling material filled between the display unit and the encapsulation substrate,
the filling material comprising a non-uniform dispersion of fillers such that an amount of the fillers in a first region closer to the display unit is higher than an amount of the fillers in a second region closer to the encapsulation substrate.

2. The organic light-emitting display apparatus of claim 1, wherein 55 wt % to 95 wt % of the fillers, based on the total weight of the fillers, are present in a range of 50% or less of a thickness of the filling material.

3. The organic light-emitting display apparatus of claim 2, wherein 40 wt % to 90 wt % of the fillers, based on the total weight of the fillers, are present in a range of 25% or less of a thickness of the filling material.

4. The organic light-emitting display apparatus of claim 1, wherein the fillers have a size of 1 μm or more, and less than or equal to one third of a thickness of the filling material.

5. The organic light-emitting display apparatus of claim 1, wherein the fillers comprise at least one of talc, mica, silica, glass fiber, silica gel, or zeolite.

6. The organic light-emitting display apparatus of claim 1, wherein the filling material comprises a first layer and a second layer on the first layer,
wherein an amount of the fillers in the first layer is higher than an amount of the fillers in the second layer.

7. The organic light-emitting display apparatus of claim 6, wherein the first layer has a thickness from 5 to 10 μm.

8. The organic light-emitting display apparatus of claim 6, wherein the amount of the fillers in the first layer is higher by 5 wt % or more than the amount of the fillers in the second layer, based on the respective total weights of the fillers in the first layer and the second layer, and the amount of the fillers in the first layer is 50 wt % or less of the total content of solid contents in the first layer.

9. The organic light-emitting display apparatus of claim 8, wherein the amount of the fillers in the first layer is higher by 10 wt % or more than the amount of the fillers in the second layer, based on the respective total weights of the fillers in the first layer and the second layer, and the amount of the fillers in the first layer is 50 wt % or less of the total content of solid contents in the first layer.

10. The organic light-emitting display apparatus of claim 1, further comprising an inorganic film between the filling material and the display unit.

11. The organic light-emitting display apparatus of claim 10, wherein the inorganic film has a thickness of 1 μm or less.

12. The organic light-emitting display apparatus of claim 1, further comprising a moisture absorbent at an inner side of the sealing member.

* * * * *